US006159659A

United States Patent [19]

Gelbart

[11] Patent Number: 6,159,659

[45] Date of Patent: Dec. 12, 2000

[54] METHOD FOR PROCESSLESS FLEXOGRAPHIC PRINTING AND FLEXOGRAPHIC PRINTING PLATE

[75] Inventor: Daniel Gelbart, Burnaby, Canada

[73] Assignee: Creo SRL, Burnaby, Canada

[21] Appl. No.: 09/298,956

[22] Filed: Apr. 26, 1999

[51] Int. Cl.[7] .............................. G03F 7/36; G03C 1/77; G03C 1/76

[52] U.S. Cl. .................. 430/306; 430/271.1; 430/275.1; 430/273.1; 430/945

[58] Field of Search ................................ 430/306, 271.1, 430/273.1, 275.1, 945, 944; 101/395, 401.1

[56] References Cited

U.S. PATENT DOCUMENTS

| | | | |
|---|---|---|---|
| 3,832,948 | 9/1974 | Barker | 101/401.1 |
| 4,060,032 | 11/1977 | Evans | 101/401.1 |
| 4,943,467 | 7/1990 | Shuji | 428/159 |
| 5,208,818 | 5/1993 | Gelbart et al. | 372/30 |
| 5,386,430 | 1/1995 | Yamagishi et al. | 372/57 |
| 5,804,353 | 9/1998 | Cushner et al. | 430/306 |

*Primary Examiner*—Janet Baxter
*Assistant Examiner*—Sin J. Lee
*Attorney, Agent, or Firm*—Oyen Wiggs Green & Mutala

[57] ABSTRACT

A plate for flexographic, or 'raised image', printing consists of a backing layer, an intermediate layer and a top layer. The backing comprises a thin metallic sheet or a thin polyester sheet for dimensional stability. The intermediate layer is a closed-cell elastomer foam. The top layer is a thin layer of solid elastomer. The intermediate layer absorbs strongly at an operating wavelength where the backing is either essentially transparent or highly reflective. When the plate is cut with a laser operating at the operating wavelength then the cutting action is self-limiting. As soon as the backing is exposed to the laser beam then the beam is either transmitted through the backing or reflected from the backing. In either case damage to the backing is avoided. Most of the thickness of the plate is in the intermediate layer which has a low density. Thus it takes much less energy to cut a plate according to the invention than is required to laser cut conventional flexographic printing plates.

43 Claims, 2 Drawing Sheets

METHOD FOR PROCESSLESS FLEXOGRAPHIC PRINTING AND FLEXOGRAPHIC PRINTING PLATE

TECHNICAL FIELD

This invention relates to raised image printing on elastomeric surfaces, which is also known as 'flexographic' printing. In particular the invention relates to methods for directly creating a raised image on flexographic printing surfaces by laser ablation of recessed areas.

BACKGROUND OF THE INVENTION

Traditional flexographic printing methods prepare a printing plate (or a printing cylinder) by molding an elastomer, such as rubber, in a mold, or by photo-polymerizing a UV sensitive polymer. These methods are slow and expensive.

While it would be highly desirable to create flexographic printing plates in the form of a seamless sleeve it is generally impractical to do so because conventional flexographic printing surfaces, such as photo-polymer plates, typically require some chemical processing. Chemical processing is impractical for seamless sleeves and is much easier to perform on flat plates.

Another technique for creating a raised pattern on an elastomer is to directly cut the raised pattern using a $CO_2$laser. The laser is controlled to ablate the elastomer in recessed areas and to leave the elastomer intact in raised areas. Direct laser processing is advantageous because it does not require any chemical processing or other intermediate process steps. As the data to be imaged is available in electronic form, it would appear that going directly from digital data to a $CO_2$ laser based engraver would be the most accurate and efficient way for making flexographic printing plates.

Conventional flexographic printing cannot be laser engraved quickly. This is because the laser must ablate a relatively thick layer (0.5 mm–2 mm) of elastomer. Further, typical elastomer materials as used in flexographic printing plates have ablation rates of only about 0.3 $mm^3$/w/sec. Thus a multi-KW laser is required to complete the task of engraving a typical flexographic plate in under one hour. Another difficulty with previous attempts at laser engraving of flexographic printing surfaces which use $CO_2$ lasers is that $CO_2$ lasers have a long wavelength (10.6 microns) which severely limits the resolution that can be achieved. The best resolution achievable with a laser is proportional to the wavelength of the laser.

Evans, U.S. Pat. No. 4,060,032 discloses a multi-layer flexographic printing plate which includes a metallic writing layer, a barrier layer, and a polymer substrate layered atop a metal backing. The polymer substrate is cellular so that its density is reduced in comparison to a solid polymer. The reduced density substrate can be laser ablated more quickly than a denser material. The Evans printing plate is developed in a two step process. First, a visible laser, such as an argon laser, is used to remove the metallic writing in portions of the plate which should be recessed to form a mask. Then an infrared laser, such as a $CO_2$ laser, is used to remove the barrier layer and a portion of the substrate layer in the areas exposed by the mask. The writing layer reflects the infrared laser beam in other areas.

The Evans methods and printing plates has three significant disadvantages. First the plates themselves are undesirably complicated to make as they have several layers including a top metallic mask layer. Second, there is a trend toward the use of thinner backings and thinner elastomeric layers in flexographic printing plates. The Evans methods can result in localized damage to thin backings if the $CO_2$ laser is allowed to ablate away all of the substrate layer in any location. A $CO_2$ laser sufficiently powerful to ablate the polymer layer in an Evans printing plate is capable of damaging thin backings. Thirdly, a $CO_2$ laser is typically incapable of achieving a resolution sufficient for making a printing plate. The Evans method is limited to creating plates in a two part process in which a high resolution mask is formed with a first laser and then the barrier layer and substrate are removed using a lower resolution $CO_2$ laser.

Barker, U.S. Pat. No. 3,832,948 discloses another method for making a printing plate. Like the method of Evans, the Barker method requires two separate laser ablation steps to create a printing plate.

Shuji, U.S. Pat. No. 4,943,467 discloses a plate for use in printing on corrugated board. The Shuji printing plate has a smooth skin layer disposed atop a foam layer. The smooth skin layer is quite thick, being in the range of 0.3 mm thick to 2.0 mm thick. The alleged advantage of the Shuji et al plate is that printing pressure can be reduced, thereby reducing damage to the corrugated board being imprinted. The Shuji et al plates are sculpted by mechanically cutting away the skin layer and the foam layer in recessed areas.

There remains a need for a method for direct laser imprinting flexographic printing plates which avoids the disadvantages set out above. There is particular need for a method for the direct laser imprinting of flexographic printing plates provided as seamless sleeves.

SUMMARY OF THE INVENTION

This invention provides methods for laser cutting recessed regions in the printing surfaces of flexographic printing plates. No mask is required.

Preferred embodiments of the invention are self-limiting and avoid the problems caused when a laser cuts too deeply and thereby damages the backing of a printing plate.

Accordingly, a first aspect of the invention provides a method for producing recessed areas in a surface of a flexographic printing plate. The method comprises providing a printing plate. The printing plate has an ablatable layer on a thin backing but no masking layer. The ablatable layer strongly absorbs radiation of an operating wavelength while the backing is substantially unaffected by radiation at the operating wavelength. The method then directs a beam of radiation of the operating wavelength at a surface of the ablatable layer adjacent a selected portion of the ablatable layer. The laser operates to remove material from the selected portion. In preferred embodiments the method continues to remove material from the selected portion until the backing is exposed. The removal of material is thereby halted.

In preferred embodiments the backing is essentially transparent at the operating wavelength. In some embodiments the backing comprises a thin polyester sheet and the operating wavelength is a wavelength at which polyester is essentially transparent. In more specific embodiments the operating wavelength is about 830 nm.

In alternative embodiments of the invention the backing is highly reflective at the operating wavelength. In some embodiments the backing comprises a thin reflective layer of a metal, such as aluminum or steel.

Preferably the ablatable layer comprises an elastomeric foam. Foam has a low density and can therefore be removed much more quickly by a laser than a solid elastomer having the same volume. Most preferably the foam comprises a dye or pigment which absorbs radiation at the operating wavelength. For example, the foam may comprise finely dispersed particles of carbon.

In some methods of the invention a stream of oxygen enriched gas is directed at the selected portion of the ablatable layer while the laser beam is directed at the selected portion of the ablatable layer. The oxygen tends to cause material ablated by the laser beam to undergo more thorough combustion, thereby reducing odors and reducing emissions of noxious gases.

In another embodiment of the invention the method produces recessed areas in a surface of a flexographic printing plate by: providing a printing plate comprising an ablatable layer on a thin backing, the ablatable layer strongly absorbing radiation of an operating wavelength and the backing substantially unaffected by radiation at the operating wavelength; directing a beam of radiation of the operating wavelength at a surface of the ablatable layer adjacent a selected portion of the ablatable layer and thereby removing material from the selected portion; and, continuing to remove material from the selected portion until the backing is exposed and the removal of material is thereby halted.

Another aspect of the invention uses an operating wavelength of approximately one micron to achieve much higher resolution that would be possible with a $CO_2$ laser operating at 10.6 microns.

The invention also provides a flexographic printing plate which consists essentially of: a thin backing which is non-absorbing at an operating wavelength; an ablatable layer on the thin backing, the ablatable layer comprising an elastomer foam which strongly absorbs radiation of the operating wavelength, the ablatable layer having a thickness in the range of 0.1 mm to 3 mm; and, a smooth thin elastomeric top layer on top of the ablatable layer, the top layer absorbing radiation of the operating wavelength and having a thickness in the range of about 0.02 mm to about 0.1 mm. The plate does not require a masking layer. The plate is preferably provided in the form of a seamless sleeve.

Further features and advantages of various embodiments of the invention are described below.

BRIEF DESCRIPTION OF THE DRAWINGS

In drawings which illustrate non-limiting embodiments of the invention.

DESCRIPTION

Figure 1:
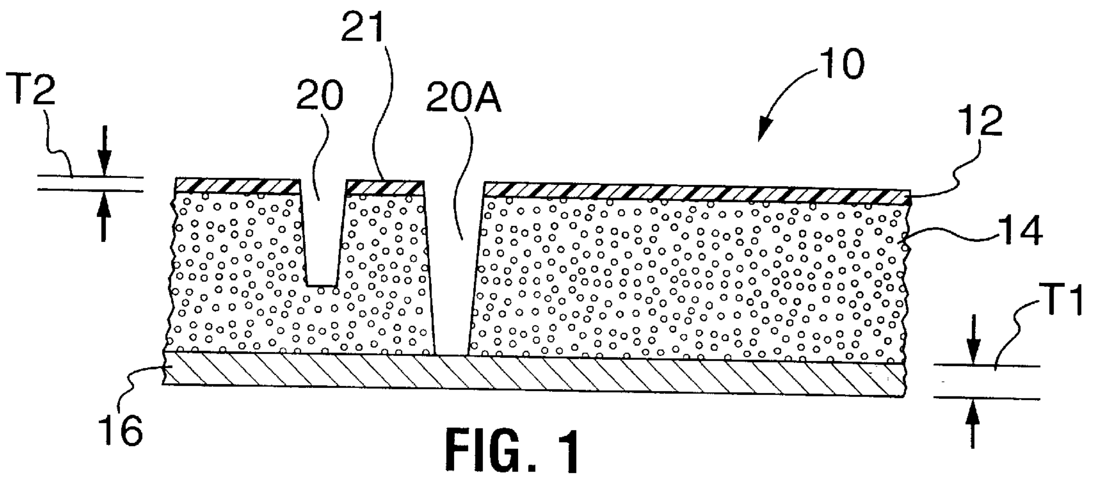
FIG. 1 shows a flexographic printing plate according to the invention.

FIG. 1, shows a flexographic printing surface 10 according to the invention. Surface 10 may be planar, as shown, or may be curved to fit an appropriate printing device. Surface 10 may be provided, for example, as a flat plate, a curved plate, a sleeve or a seamless sleeve. Since the printing surface of this invention does not require chemical processing, printing surface 10 can be advantageously provided in the form of a seamless sleeve. As noted above, there are significant advantages to providing printing plates in the form of seamless sleeves.

Surface 10 comprises a thin elastomeric top layer 12, an intermediate layer 14 of closed cell elastomeric foam, and a backing 16. For reasons to be described below backing 16 is either highly reflective of or transparent to laser radiation at a given operating wavelength at which intermediate layer 14 is strongly absorbing. Backing 16 preferably comprises a thin metallic sheet or a thin polyester sheet.

Top layer 12 may be made of the same elastomer as intermediate layer 14 or from a different elastomer. Top layer 12 is typically a neoprene, a thermoplastic elastomer or a polyurethane elastomer. The material of top layer 12 is selected to have good inking characteristics. Top layer 12 preferably has a thickness T2 in the range of about 0.02 mm to about 0.1 mm. No masking layer is required in or on surface 10.

Intermediate layer 14 may be a foamed version of the same elastomer used for top layer 12, or may be a different elastomer. Intermediate layer 14 is preferably a material having the desired mechanical properties for printing, and which is rapidly laser ablatable. Intermediate layer 14 may be called an "ablatable layer" because it can be removed by a laser operating at the operating wavelength.

As most flat flexographic plates are manufactured by extrusion, the material of intermediate layer 14 is preferably a material which can be readily extruded during plate manufacturing. It is sometimes difficult to maintain exact control over thickness when extruding foams.

A preferred alternative to the use of a conventional extruded foam for intermediate layer 14 is to create intermediate layer 14 by extruding a mixture of an elastomer and a high concentration (up to 90% by volume) of plastic or glass micro-balloons. Micro balloons have a size of about 50–100 microns and a wall thickness of a few microns, thus most of their volume is gas. Micro-balloons are readily available from Minnesota Mining and Manufacturing Corporation (3M Corporation) of Minneapolis Minn., as well as from Dow Corning and other suppliers. An intermediate layer 14 made with micro-balloons has a consistency which is more uniform than that of most foams.

Intermediate layer 14 preferably includes an absorbant such as graphite or a suitable dye which strongly absorbs laser radiation of the wavelength at which backing 16 is either highly reflective or transparent (i.e. the operating wavelength).

Intermediate layer 14 may also include oxidants, such as molecules which contain nitrate groups. The oxidants react exothermically when heated with a laser and therefore increase laser ablation rates. The oxidants also reduce odors and toxic emissions which are released when intermediate layer 14 is ablated. In the presence of oxidants, full combustion of the carbon, hydrogen and nitrogen is achieved, generating $CO_2$, $H_2O$ and $NO_2$, instead of the more toxic CO, NO, etc.

Backing 16 is preferably a thin sheet of a dimensionally stable polymer, such as polyester or a thin sheet of metal. Backing 16 preferably has a thickness T1 of about 0.1 mm to about 0.3 mm if made of metal and a thickness T1 in the range of about 0.15 mm to about 1 mm if made of polyester. Preferred materials for backing 16 are polyester, aluminum and steel.

Figure 2:
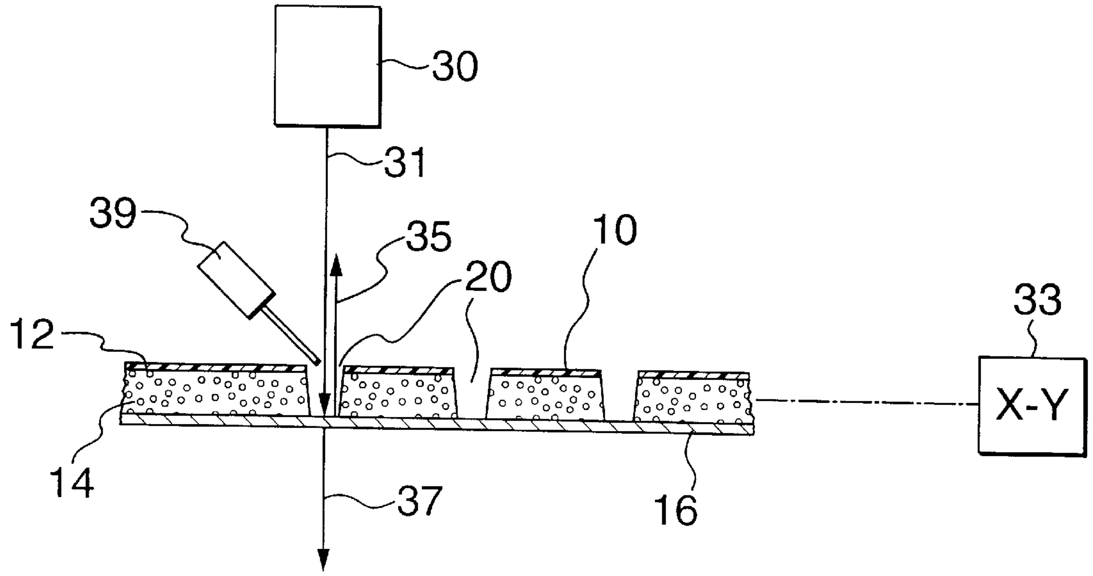
FIG. 2 is a schematic view of apparatus for practising the invention.

Surface 10 can be prepared for printing by direct laser ablation of top layer 12 and intermediate layer 14 as shown in FIG. 2. A suitable laser 30 provides a beam 31 of coherent radiation at the operating wavelength. Laser 30 is preferably a laser diode operating at a wavelength in the range of about 700 nm to about 1200 nm. The time taken to imprint surface 10 may be reduced by providing an array of laser diodes which each imprint portions of surface 10. Laser beam 31 preferably has an operating wavelength sufficiently small to pattern surface 10 with a desired resolution without the use of a mask.

Laser beam 31 (FIG. 2) is absorbed by the material of top layer 12 and intermediate layer 14. Laser beam 31 cuts quickly through thin top layer 12 and cuts rapidly a recess 20A into intermediate layer 14 leaving a raised feature 21. The volumetric cutting rate is inversely proportional to the density of the material being removed. As most of the volume of intermediate layer 14 is made up of air (or another gas, such as nitrogen), the density of intermediate layer 14 is low and the rate of removal of intermediate layer 14 is greatly enhanced.

As noted above, it is also desirable for intermediate layer 14 to include materials which react exothermically as material is ablated from intermediate layer 14. This further increases the ablation rate of intermediate layer 14 without requiring more power from laser 30.

Laser beam 31 may be scanned over printing plate 10 in any suitable manner. FIG. 2 shows a system in which laser beam 31 is stationary while printing plate 10 is moved with a computer-controlled X-Y positioner 33. Laser beam 31 may be switched on and off as laser beam 31 is scanned over plate 10 so that the surface of plate 10 is ablated only in selected areas.

Of course, all that is necessary is that laser beam 31 be moved relative to plate 10. Laser beam 31 could be scanned across the surface of plate 10 while plate 10 is held stationary or both plate 10 and laser beam 31 may be moved in a manner such that the laser beam 31 removes material from selected recessed areas 20.

Also as shown in FIG. 2, a nozzle 39 may be provided to direct a jet of gas enriched in oxygen toward the point at which laser beam 31 is cutting plate 10. The oxygen from nozzle 31 encourages the materials ablated from plate 10 to combust fully and therefore reduces odors and toxic emissions. A suction nozzle (not shown) may be provided to remove, by suction, smoke and other ablation by-products.

As noted above, a problem in the prior art is that laser damage may be caused to the thin backings used in modern flexographic printing plates. Such damage occurs when the backing is exposed to the laser beam as happens after all overlying material is ablated away as shown in recessed area 20A of FIG. 1. Small holes and nicks in the backing 16 can undesirably reduce the life of a printing plate 10.

This invention provides a self-limiting method for ablating intermediate layer 14. As noted above, intermediate layer 14 is opaque (i.e. strongly absorbing) to laser beam 31. However, backing 16 does not absorb laser beam 31. Therefore, if laser beam 31 ablates away all of intermediate layer 14 in one place laser beam 31 simply passes through backing 16 as indicated by arrow 37. Laser beam 31 does not damage backing 16.

In the alternative, if backing 16 is highly reflective to laser beam 31 then laser beam 31 will simply be reflected, as indicated by arrow 35, after all of intermediate layer 14 is ablated away in any spot. In either case, laser beam 31 will not damage backing 16.

EXAMPLE 1

A flexographic printing plate was made by laminating a 1 mm thick closed cell black polyurethane foam (from Intertape Polymer Group Inc. of Charlotte, N.C.) to a backing of 0.1 mm thick cold-rolled steel sheet. The foam had a density of about 20% that of solid polyurethane. The foam was ablated using the beam from a 1 Watt laser diode operating at a wavelength of 830 nm and focussed to a spot 10 microns in diameter. It was found that the foam absorbed the incident laser beam and the foam was removed. The cutting rate was about 3 minutes per $cm^3$ of foam. Cutting stopped immediately at any spot as soon as the metal backing became exposed. The metal backing was not damaged. In practical commercial applications, a large number of laser diodes would be used simultaneously to reduce the time needed to create an imprinted printing surface.

EXAMPLE 2

A printing plate was prepared in the same manner described for Example 1 except that the backing was a 0.2 mm thick polyester sheet. It was found that cutting stopped as soon as the polyester sheet was exposed. The polyester sheet backing was not damaged by the laser beam. The polyester sheet was essentially transparent at 830 nm.

As will be apparent to those skilled in the art in the light of the foregoing disclosure, many alterations and modifications are possible in the practice of this invention without departing from the spirit or scope thereof. For example, if lower quality printing is acceptable then top layer 12 may be omitted. Top layer 12 can be omitted where intermediate layer 14 has acceptable inking qualities and the pores in intermediate layer 14 are sufficiently small that they do not cause unacceptable edge roughness in the printed article.

While in preferred embodiments of the invention the backing is non-absorbing at the operating wavelength it is sufficient for the practice of the invention that the backing is substantially unaffected by the radiation used to remove the ablatable layer. For example, the invention could be practised with a metal backing having an absorbing coating and a sufficiently high thermal conductivity that radiation at the operating wavelength is absorbed by the absorbing coating and dissipated in the metal backing without substantially affecting the backing.

Figure 3:
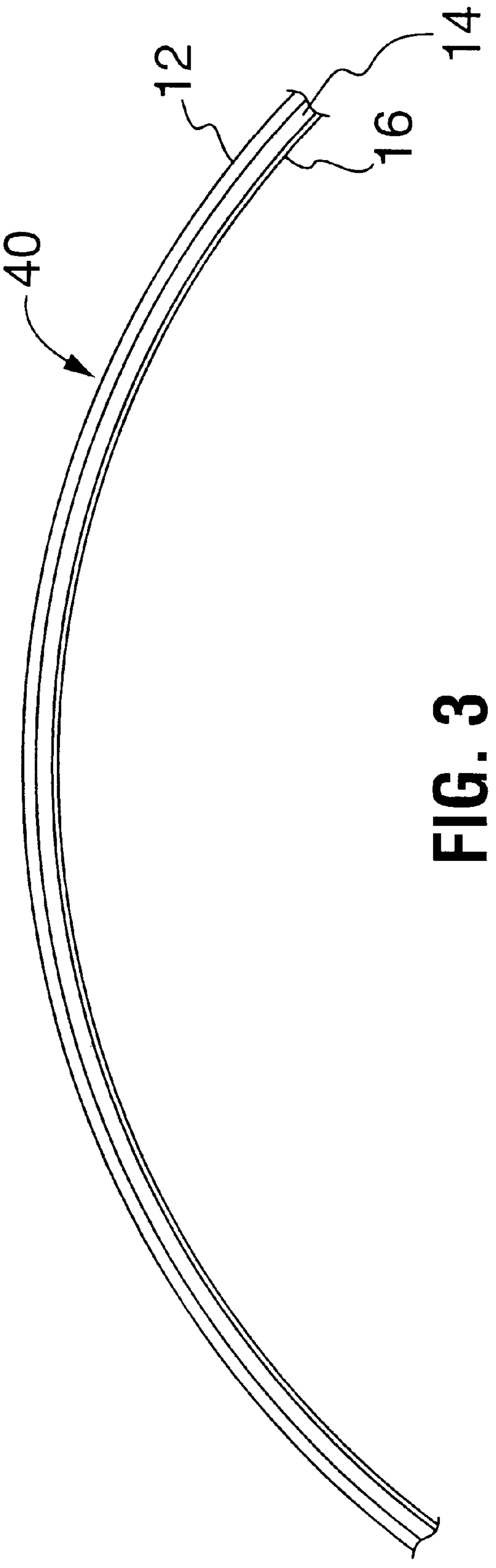
FIG. 3 is a partial section through a flexographic printing plate according to the invention provided in the form of a seamless sleeve.

The invention is well adapted to imprinting printing plates which are provided in the form of seamless sleeves 40 as shown in FIG. 3. Seamless sleeves are highly desirable as printing plates, in part because a seamless sleeve cannot become distorted as it is mounted in a printing press in the same ways that flat plates can be come distorted when they are mounted onto cylindrical drums in a printing press. It is very difficult to provide conventional flexographic printing surfaces, such as photo-polymer plates, as seamless sleeves because such surfaces require chemical processing. Chemical processing is much easier to perform on plates provided in sheet form. The invention does not require any chemical processing.

Accordingly, the scope of the invention is to be construed in accordance with the substance defined by the following claims.

What is claimed is:

1. A method for producing recessed areas in a surface of a flexographic printing plate, the method comprising:

a) providing a printing plate comprising an ablatable layer on a thin backing, the ablatable layer strongly absorbing radiation of an operating wavelength and the backing substantially unaffected by radiation at the operating wavelength, the printing plate lacking a masking layer;

b) directing a beam of radiation of the operating wavelength at a surface of the ablatable layer adjacent a selected portion of the ablatable layer and thereby removing material from the selected portion wherein the printing plate comprises a thin top layer of an elastomer having a chemical composition the same as that of the ablatable layer, the ablatable layer contains voids and the top layer is substantially free of voids, and the method includes directing a beam of radiation of the operating wavelength at a surface of the top layer and thereby removing a portion of the top layer before directing the beam of radiation of the operating wavelength at a surface of the ablatable layer.

2. The method of claim 1 wherein the plate is provided in the form of a seamless sleeve.

3. The method of claim 1 comprising continuing to remove material from the selected portion until the backing is exposed and the removal of material is thereby halted.

4. The method of claim 3 wherein the backing is non-absorbing at the operating wavelength.

5. The method of claim 4 wherein the backing is essentially transparent at the operating wavelength.

6. The method of claim 5 wherein the backing comprises a thin polyester sheet and the operating wavelength is a wavelength at which polyester is essentially transparent.

7. The method of claim 6 wherein the operating wavelength is in the range of about 700 nm to about 1200 nm.

8. The method of claim 7 wherein the operating wavelength is about 830 nm.

9. The method of claim 1 wherein the ablatable layer comprises an elastomeric foam.

10. The method of claim 9 wherein the foam comprises a dye which absorbs radiation at the operating wavelength.

11. The method of claim 9 wherein the ablatable layer comprises finely dispersed carbon particles which absorb radiation at the operating wavelength.

12. The method of claim 9 wherein the ablatable layer comprises an oxidant which reacts exothermically while the beam is directed at the selected portion of the ablatable layer.

13. The method of claim 1 comprising directing a stream of oxygen enriched gas at the selected portion while the beam is directed at the selected portion of the ablatable layer.

14. The method of claim 3 wherein the backing is highly reflective at the operating wavelength.

15. The method of claim 14 wherein the backing comprises a metallic sheet.

16. The method of claim 14 wherein the operating wavelength is in the range of about 700 nm to about 1200 nm.

17. The method of claim 16 wherein the backing has a thickness of less than 0.2 mm.

18. The method of claim 1 wherein the top layer has a thickness in the range of about 0.02 mm to about 0.1 mm.

19. A method for producing recessed areas in a surface of a flexographic printing plate, the method comprising:

a) providing a printing plate comprising an ablatable layer on a thin backing, the ablatable layer strongly absorbing radiation of an operating wavelength and the backing substantially unaffected by radiation at the operating wavelength; and, b) directing a beam of radiation of the operating wavelength at a surface of the ablatable layer adjacent a selected portion of the ablatable layer and thereby removing material from the selected portion;

wherein the ablatable layer comprises an oxidant which reacts exothermically while the beam is directed at the selected portion of the ablatable layer.

20. The method of claim 19 wherein the plate is provided in the form of a seamless sleeve.

21. The method of claim 19 comprising continuing to remove material from the selected portion until the backing is exposed and the removal of material is thereby halted.

22. The method of claim 21 wherein the backing is non-absorbing at the operating wavelength.

23. The method of claim 22 wherein the backing is essentially transparent at the operating wavelength.

24. The method of claim 23 wherein the backing comprises a thin polyester sheet and the operating wavelength is a wavelength at which polyester is essentially transparent.

25. The method of claim 24 wherein the operating wavelength is in the range of about 700 nm to about 1200 nm.

26. The method of claim 22 wherein the backing is highly reflective at the operating wavelength.

27. The method of claim 26 wherein the backing comprises a metallic sheet.

28. The method of claim 27 wherein the backing has a thickness of less than 0.2 mm.

29. The method of claim 26 wherein the operating wavelength is in the range of about 700 nm to about 1200 nm.

30. The method of claim 19 wherein the ablatable layer comprises an elastomeric foam.

31. The method of claim 30 wherein the foam comprises a dye which absorbs radiation at the operating wavelength.

32. The method of claim 30 wherein the ablatable layer comprises finely dispersed carbon particles which absorb radiation at the operating wavelength.

33. The method of claim 19 comprising directing a stream of oxygen enriched gas at the selected portion while the beam is directed at the selected portion of the ablatable layer.

34. The method of claim 19 wherein the printing plate comprises a thin top layer of an elastomer and the method includes directing a beam of radiation of the operating wavelength at a surface of the top layer and thereby removing a portion of the top layer before directing the beam of radiation of the operating wavelength at a surface of the ablatable layer.

35. The method of claim 34 wherein the top layer has a thickness in the range of about 0.02 mm to about 0.1 mm.

36. The method of claim 34 wherein the top layer has a chemical composition different from that of the ablatable layer.

37. A flexographic printing plate consisting essentially of:

a) a thin backing which is substantially unaffected by radiation at an operating wavelength;

b) an ablatable layer on the thin backing, the ablatable layer comprising an elastomer foam which strongly absorbs radiation of the operating wavelength, the ablatable layer having a thickness in the range of 0.1 mm to 3 mm;

c) a smooth thin elastomeric top layer on top of the ablatable layer, the top layer absorbing radiation of the operating wavelength and having a thickness in the range of about 0.02 mm to 0.1 mm wherein the top layer has a chemical composition the same as that of the ablatable layer, the ablatable layer contains voids and the top layer is substantially free of voids.

38. The flexographic printing plate of claim 31 wherein the backing is non-absorbing to radiation at the operating wavelength.

39. The flexographic printing plate of claim 38 wherein the backing comprises a polyester sheet which is transparent at the operating wavelength.

40. The flexographic printing plate of claim 39 wherein the operating wavelength is in the range of about 700 nm to about 1200 nm.

41. The flexographic printing plate of claim 38 wherein the backing comprises a metallic sheet which is highly reflective at the operating wavelength.

42. The flexographic printing plate of claim 38 provided in the form of a seamless sleeve.

43. The flexographic printing plate of claim 37 provided in the form of a seamless sleeve.

* * * * *